(12) United States Patent
Jang et al.

(10) Patent No.: US 6,356,494 B2
(45) Date of Patent: Mar. 12, 2002

(54) AUTOMATIC PRECHARGE APPARATUS OF SEMICONDUCTOR MEMORY DEVICE

(75) Inventors: Ji Eun Jang; Mi Young Kim; Jae Jin Lee, all of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/751,455

(22) Filed: Jan. 2, 2001

(30) Foreign Application Priority Data

Dec. 30, 1999 (KR) ............................................. 99-66549
Dec. 19, 2000 (KR) ........................................ 2000-78455

(51) Int. Cl.[7] ................................................. G11C 7/00
(52) U.S. Cl. ........................ 365/203; 365/233; 365/194
(58) Field of Search ................................. 365/203, 233, 365/194

(56) References Cited

U.S. PATENT DOCUMENTS 5,014,245 A * 5/1991 Muroka et al. ............. 365/194
5,608,674 A * 3/1997 Yabe et al. ............. 365/189.05
6,104,651 A * 8/2000 Cowles et al. ............... 365/201

* cited by examiner

Primary Examiner—Richard Elms
Assistant Examiner—Tuan T. Nguyen
(74) Attorney, Agent, or Firm—Pillsbury Winthrop LLP

(57) ABSTRACT

The present invention discloses an automatic precharge apparatus of a semiconductor memory device. An object of the present invention is to perform a sable precharge operation unrelated to change of the clock frequency by controlling to perform an precharge operation after constant delay time, regardless of an external clock signal. The automatic precharge apparatus of a semiconductor memory device comprises an automatic precharge signal generating unit receiving external control signals and then generating an internal precharge command signal, and outputting an automatic precharge signal by using the internal precharge command signal and control signals being related to a bust operation, a ras precharge signal generating unit for generating a ras precharge signal by receiving the automatic precharge signal, a delay unit for outputting a write recovery signal with a constant delay time, which is disabled in the reading operation and only enabled in the writing operation, when an internal precharge command signal is inputted, a ras generating unit for generating a ras signal without a delay time when inputting an external precharge command signal, whereas after a constant delay time in response to the write recovery signal when inputting the ras precharge signal.

18 Claims, 9 Drawing Sheets

AUTOMATIC PRECHARGE APPARATUS OF SEMICONDUCTOR MEMORY DEVICE

BACKGROUND

1. Field of the Invention

The present invention relates in general to an automatic precharge apparatus of a semiconductor memory device.

2. General Background and Related Art

In a semiconductor memory automatic precharge arrangement according to conventional art, when a precharge command signal is input from an external source, a precharge operation is carried out, synchronized with the period of an external clock signal. When an internally generated precharge command signal is input, after writing/reading operations with a predetermined bust length in an internal circuit, a precharge operation is performed, synchronized with the period of an external clock signal.

When a semiconductor memory is driven by using a known auto precharge arrangement, which performs a precharge operation, synchronizing with the period of the external clock signal, the precharge arrangement controls so that in general, when a clock frequency is high, a precharge command signal is input from the outside after 2 to 3 clock periods and when a clock frequency is low, a precharge command signal is input after a predetermined period of time, such as, for example, 1 clock period.

However, in conventional precharge arrangements in which a precharge command signal is input, synchronized with the period of the external clock signal, there are several operational disadvantages. When the clock frequency of the external clock signal is high, a precharge command signal generated internally is input at high speed, and a high-speed precharge operation is performed. On the other hand, when the frequency of the clock signal is low, a precharge operation is performed after a longer period of time that is more than required to accomplish the desired result.

FIG. 1 is a timing diagram illustrating the operations of a conventional precharge arrangement that has the operational disadvantages mentioned above. After inputting a writing/reading signal Wt_RDb, a precharge operation is performed, synchronized with a clock signal CLK after a bust length (BL=the period of 4 clock pulses).

Since a precharge operation is performed, synchronized with a clock signal after inputting a writing/reading signal Wt_RDb and then a RAS signal is generated, there are operational disadvantages. When operating at a high frequency, a precharge operation is performed without fully securing a margin of an operation, thus there is a higher frequency of faulty operation. Conversely, during low frequency operationen, more clock pulses are used than necessary in an internal precharge operation so that the clocks hinder a high-speed operation.

SUMMARY

The claimed inventions feature, at least in part, a novel precharge arrangement for a semiconductor memory device. When an internal precharge command signal is input in writing/reading operations regardless of an external clock signal, a precharge operation is performed with a constant delay time after performing the last bust operation. It is controlled when an internal precharge command signal is input in writing/reading operations. A precharge operation is performed, synchronized with an external clock signal, after performing the last bust operation in the reading operation, and a precharge operation is performed after a constant delay time following by the last bust operation in the writing operation.

An exemplary embodiment of the automatic precharge apparatus of a semiconductor memory device includes an automatic precharge signal generating unit which receives external control signals and then generates an internal precharge command signal, and outputs an automatic precharge signal by using the internal precharge command signal and control signals related to a bust operation. A ras precharge signal generating unit receives the automatic precharge signal and then generates a ras precharge signal. A delay unit outputs a write recovery signal with a constant delay time, which is disabled in the reading operation and only enabled in the writing operation, when an internal precharge command signal is input in writing/reading operations. A ras generating unit generates a ras signal without a delay time when inputting an external precharge command signal, whereas after a constant delay time in response to the write recovery signal when inputting the ras precharge signal.

Thus, the claimed inventions feature an automatic precharge arrangement for a semiconductor memory device in which when a precharge command signal is input from an external source a precharge operation is performed without a delay time. However, when a precharge command signal is inputted from the inside, after writing/reading operations with a predetermined bust length in an internal circuit, a precharge operation is performed after a constant delay time regardless of the period of an external clock signal.

BRIEF DESCRIPTION OF THE DRAWINGS

The present invention will be explained in terms of exemplary embodiments described in detail with reference to the accompanying drawings, which are given only by way of illustration and thus are not limitative of the present invention, wherein.

DETAILED DESCRIPTION

An automatic precharge apparatus of a semiconductor memory device in accordance with exemplary preferred embodiments of the present invention will now be described with reference to the accompanying drawings.

Figure 1:
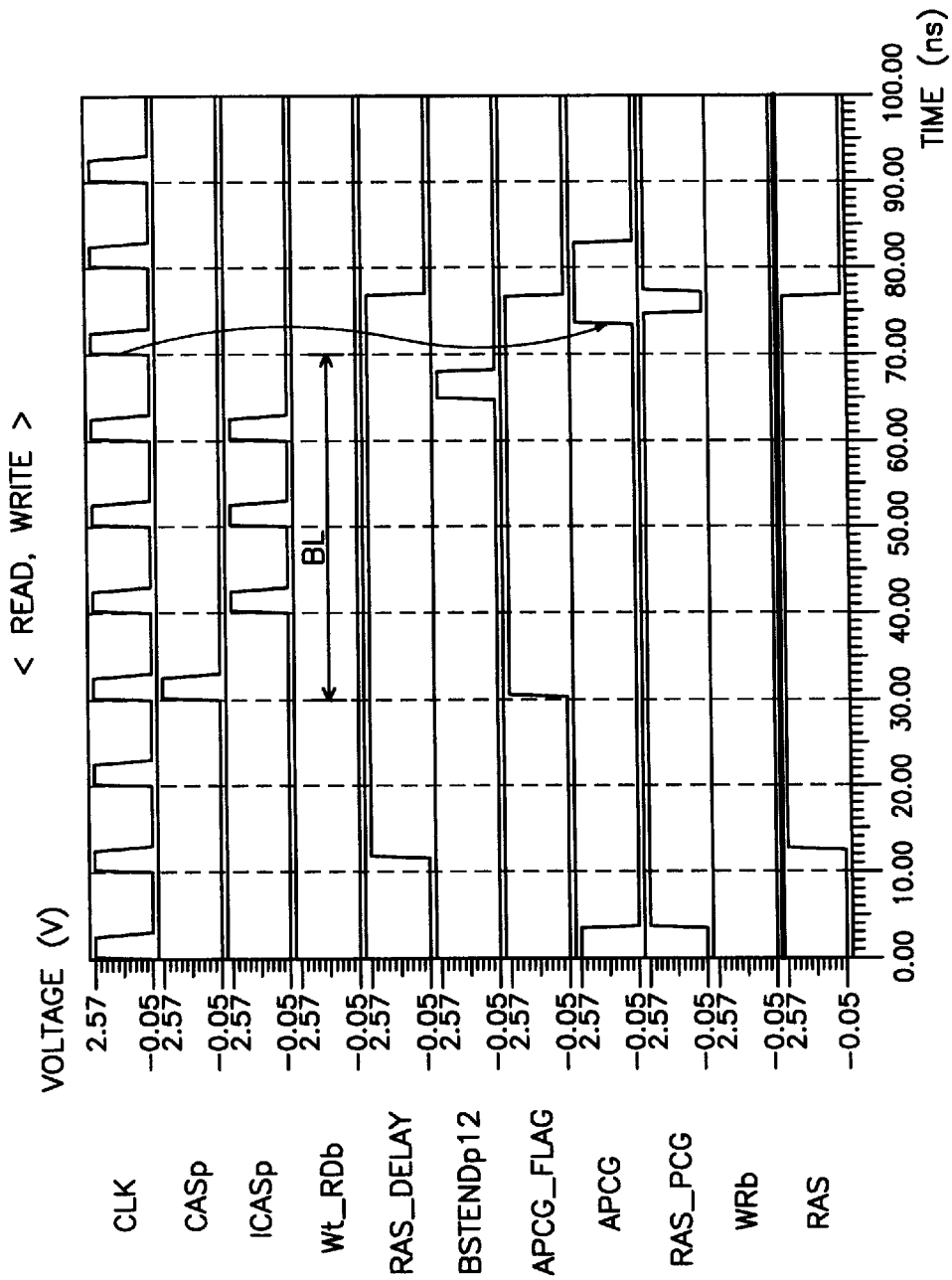
FIG. 1 is a timing diagram illustrating operations of a conventional automatic precharge apparatus of a semiconductor memory device.
Figure 2A:
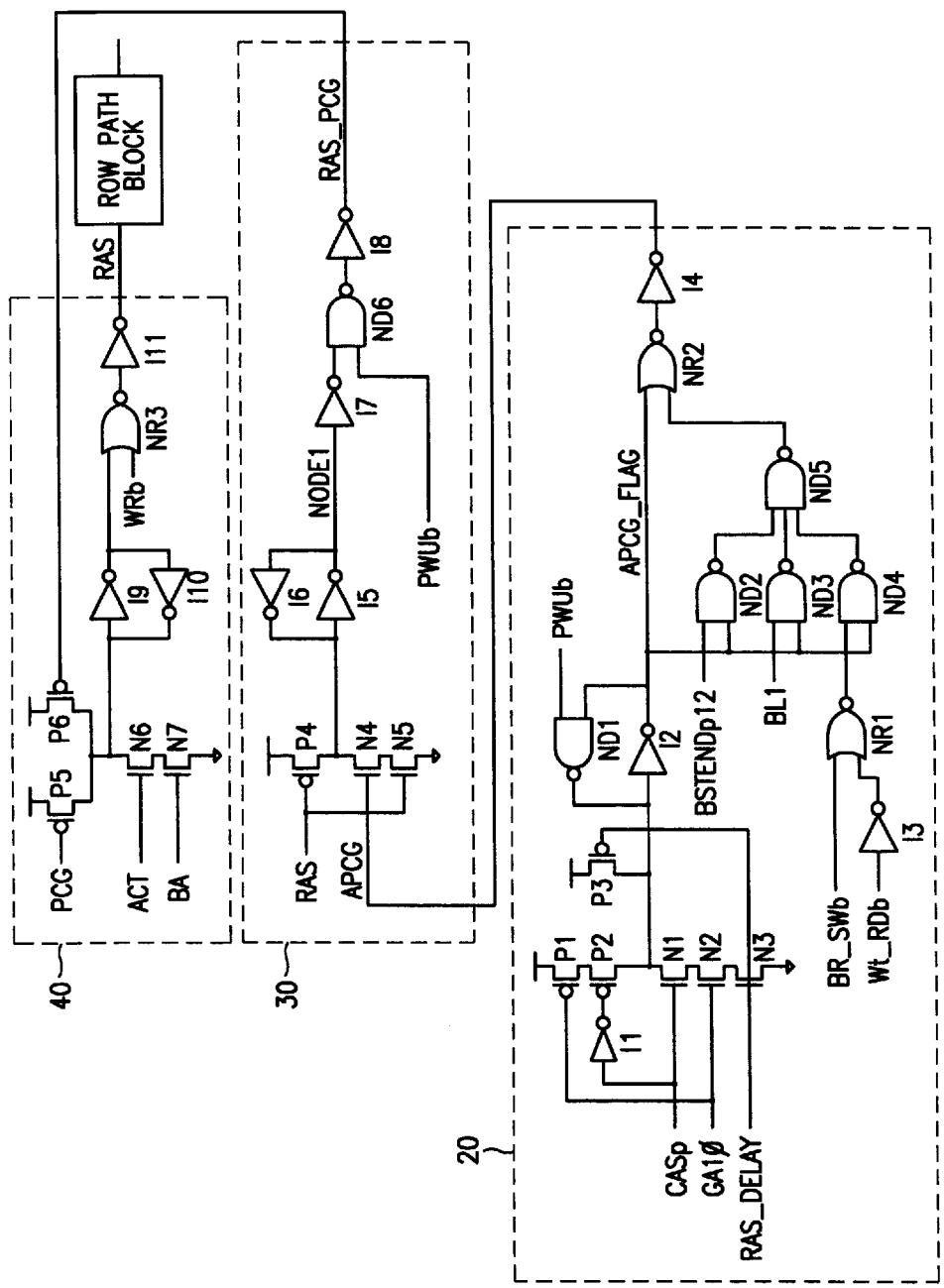
FIGS. 2a and 2b are circuit diagrams of an automatic precharge apparatus of a semiconductor memory device in accordance with a first embodiment of the present invention.
Figure 2B:
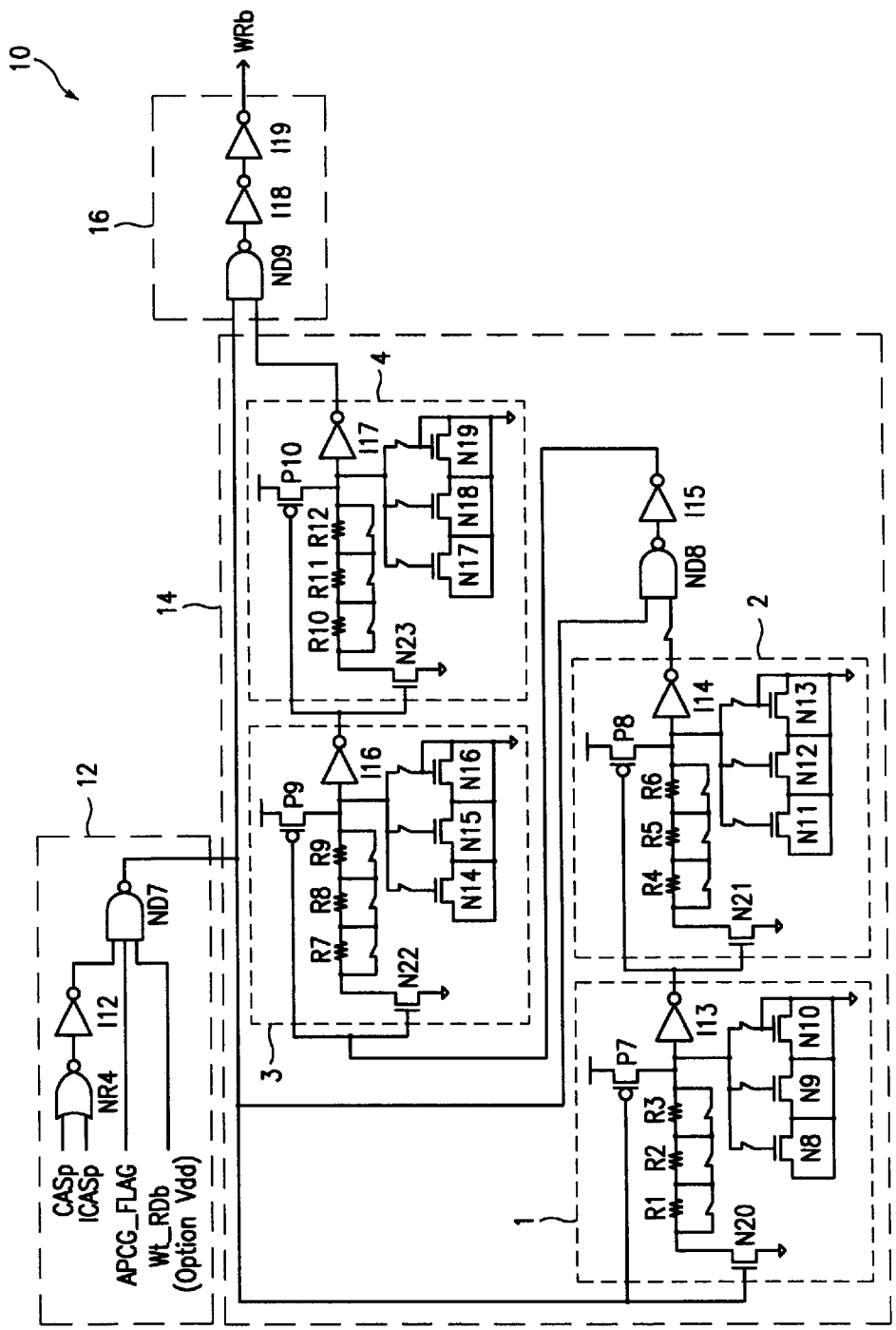

FIGS. 2a and 2b are circuit diagrams of an automatic precharge apparatus of a semiconductor memory device in accordance with a first exemplary embodiment of the invention. When a precharge command signal PCG is input from an external source regardless of an external clock signal CLK, a precharge operation is performed without a delay time. But when an internal precharge command signal APCG_FLAG is input, after performing the last bust operation, a precharge operation is performed after a predetermined constant delay time.

An automatic precharge signal generating unit 20 receives control signals such as a CASp and a RAS_DELAY and then generates an internal precharge command signal APCG_FLAG, and outputs an automatic precharge signal APCG for determining whether a precharge operation is performed or not by using the generated internal precharge command signal APCG_FLAG and control signals such as BSTENDp12, BL1, and BR_SWb related to a bust operation. A ras precharge signal generating unit 30 receives the automatic precharge signal APCG and generates a ras precharge signal RAS_PCG, which determines whether or not ras is generated. A delay unit 10 outputs a write recovery signal WRb with a predetermined constant delay time, which is disabled in a reading operation and only enabled in a writing operation, when an internal precharge command signal APCG_FLAG is inputted, in the writing/reading operations. A ras generating unit 40 generates a ras signal RAS without a delay time when inputting an external precharge command signal PCG, whereas after a constant delay time in response to the write recovery signal WRb when inputting the ras precharge signal RAS_PCG.

As shown in FIG. 2a, the automatic precharge signal generating unit 20 includes a PMOS transistor P1, which is connected with the power voltage. Its gate is couple to receive external address GA10. An inverter I1 receives and inverts an external control signal CASp. A PMOS transistor P2 receives at its gate the output of inverter I1. The source of P2 is connected with the drain of the PMOS transistor P1. A NMOS transistor N1 has its drain connected with the drain of the PMOS transistor P2. External control signal CASp is inputted to to the gate of transistor N1. A NMOS transistor N2 has a drain connected with the source of the NMOS transistor N1 and the external address GA10 is input to its gate. A NMOS transistor N3 has a drain connected with the source of the NMOS transistor N2 and its source is connected with the ground and a ras delay signal RAS_DELAY is inputted to its gate. A PMOS transistor P3 has a gate connected with a bulk of the NMOS transistor N3 and its source connected with the power voltage. An inverter 12 has an input connected with the drain of the PMOS transistor P3. A NAND gate ND1 receives and NANDs an output signal of the inverter 12 and a power-up signal PWUb. An inverter 13 receives and inverts a writing/reading signal Wt_RDb. A NOR gate NR1 receives and NORs a bust reading single write signal BR_SWb and an output signal of the inverter 13. A plurality of NAND gates ND2,ND3 and ND4 receive an internal precharge command signal APCG_FLAG, a bust finish signal BSTENDp12, and a signal BL1 of bust length of 1 (one clock period), and an output signal of the NOR gate NR1. A NAND gate ND5 receives and NANDs the output signals of the plurality of NAND gates ND2, ND3,and ND4. A NOR gate NR2 receives and NORs the internal precharge command signal APCG_FLAG and an output signal of the NAND gate ND5. An inverter I4 receives and inverts an output signal of the NOR gate NR2 and then outputs an automatic precharge signal APCG.

Operation of the automatic precharge signal generating unit 20 according to the present invention will be described. The meaning that an external address GA10 becomes a high level is that an automatic precharge operation is performed after a writing/reading operation. Here, a writing/reading signal maintains a high level during a writing operation, and maintains a low level during a reading operation.

Accordingly, when an external control signal CASp, an external address GA10, and a ras delay signal RAS_DELAY become high, an internal precharge command signal APCG_FLAG becomes high. Since NAND gates ND2, ND3 and ND4 receive an internal precharge command signal APCT_FLAG, a bust finish signal BSTENDp12, and a signal BL1 of bust length of 1 (one clock period), as input signals, it becomes stand-by. That is, when the internal precharge command signal APCG_FLAG is at a high level, if the bust finish signal BSTENDp12 is enabled, the automatic precharge signal APCG is enabled.

A ras precharge signal generating unit 30 illustrated in FIG. 2a comprises a PMOS transistor P4 having a source connected with the power voltage and a gate coupled to receive the ras signal RAS. An NMOS transistor N4 has a drain connected to the drain of the PMOS transistor P4 and an automatic precharge signal APCG outputted from the automatic precharge signal generating unit 20 is inputted to its gate. An NMOS transistor N5 has a drain connected with the source of the NMOS transistor N4. Its source is connected with the ground and a ras signal RAS is inputted to its gate. Latch circuits I5 and I6 are connected with the common contact point of the PMOS transistor P4 and the NMOS transistor N4. An inverter I7 receives and inverts the output signal of the latch circuits I5 and I6. NAND gate ND6 receives and NANDs the output signal of the inverter I7 and a power-up signal PWUb. Inverter I8 receives and inverts the output signal of the NAND gate ND6 and then outputs ras precharge signal RAS_PCG.

Operation of the ras precharge signal generating unit 30 according to the present invention will now be described. After an automatic precharge signal APCG outputted from the automatic precharge signal generating unit 20 is enabled, in a state that the ras signal RAS maintains a high level, that is, when a ras signal RAS and the automatic precharge signal APCG are at a high level, if a node 1 becomes a high level by turning on the NMOS transistors N4 and N5, the ras precharge signal RAS_PCG generates a pulse of a low level.

Delay unit 10 (shown in FIG. 2b) includes a logic circuit unit 12 for receiving and logic combining the external control signals CASp and an internal control signal ICASp, the internal precharge command signal APCG_FLAG, and the writing/reading signal Wt_RDb. A delay circuit unit 14 receives an output signal of the logic circuit unit 12 and delays it for a predetermined constant time. An output buffer unit 16 receives and logic combines output signals of the logic circuit unit 12 and the delay circuit unit 14 and outputs the result to the ras generating unit 40.

Logic circuit unit 12 includes a NOR gate NR4 for receiving and logic combining the external and internal control signals CASp and ICASp, the internal precharge command signal APCG_FLAG, and the writing/reading signal Wt_RDb. Inverter I12 receives and inverts the output signal of the NOR gate NR4, and an NAND gate ND7 for receiving and logic combining the output signal of the inverter I12, the internal precharge command signal APCG_FLAG, and the writing/reading signal Wt_RDb.

Delay circuit unit 14 includes a plurality of delay control units 1,2,3, and 4, and delays time only for a writing operation. Respective delay control units 1,2,3, and 4 comprises a PMOS transistor P7 having its source connected with the power voltage and the output signal of the logic circuit unit 12 is applied to its gate. An NMOS transistor N20 has its source connected with the ground voltage and the output signal of the logic circuit unit 12 is applied to its gate. A plurality of resistors R1,R2, and R3 are connected with the drain of the NMOS transistor N20. An inverter I13 is connected to resistors R1,R2, and R3. A plurality of NMOS transistors N8,N9, and N10 are connected between the common contact point of the PMOS transistor P7, the inverter I13, and the resistor R3 and the ground voltage.

Output buffer unit 16 comprises an NAND gate ND9 for receiving and logic combining output signals of the logic circuit unit 12 and the last delay control unit 4 among the plurality of delay control units 1,2,3, and 4. A plurality of inverters I18 and I19 receive and invert the output signal of the NAND gate ND9.

Operation of the delay unit 10 (shown in FIG. 2b) will be described. When the internal precharge command signal APCG_FLAG is input at a high level, in the reading/writing operations, the write recovery signal WRb of a low level is outputted because the writing/reading signal Wt_Rdb is at a low level. When the external and internal control signals CASp and ICASp are input at a high level, the write recovery signal WRb of a high level is output because the writing/reading signal Wt_Rdb is at a high level.

In a case that a precharge operation is performed after performing a writing/reading operation with a predetermined bust length of BL=4 in internal of the circuit by inputting the internal precharge command signal APCG_FLAG, the delay unit 10 is added in order to perform a precharge operation after a predetermined constant delay time regardless of the period of the external clock signal.

The ras generating unit 40 (shown in FIG. 2a) comprises a PMOS transistor P5 having its source connected with the power voltage and a precharge command signal PCG input from an external source is applied to its gate. A PMOS transistor P6 has its source connected with the power voltage and has the ras precharge signal RAS_PCG generated from the ras precharge signal generating unit 30 applied to its gate. An NMOS transistor N6 has its drain connected with the common contact point of PMOS transistors P5 and P6 and an active signal ACT is applied to its gate. An NMOS transistor N7 has its drain connected with the source of the NMOS transistors N6. Its source is connected with the ground and a bank address BA is applied to its gate. Latch circuits I9 and I10 are connected between the common contact point of the PMOS transistors P5 and P6 and the drain of the NMOS transistor N6. An NOR gate NR3 receives and logic combines the output signal of the latch circuits I9 and I10 and the write recovery signal WRb output from the delay unit 10. An inverter I11 receives and inverts the output signal of the NOR gate NR3 and then generates a ras signal RAS.

Operation of the ras generating unit 40 will now be described. When inputting the active signal ACT and the bank address signal BA, a ras signal RAS is enabled at a high level. At this time, in a state that the writing/reading signal Wt_RDb is not input, since external and internal control signals CASp and ICASp are not generated, the write recovery signal WRb output from the delay unit 10 is at a low level. Next, if the writing/reading signal Wt_RDb is input and so the external and internal control signals CASp and ICASp are generated, the write recovery signal WRb maintains a low level during a reading operation, whereas it is enabled at a high level during a writing operation.

When the ras precharge signal RAS_PCG generates a pulse of low level by the operation of the ras precharge signal generation unit 30, the ras precharge signal RAS_PCG is input to the gate of the PMOS transistor P6, thereby turning on the PMOS transistor P6. At this time, the ras signal RAS is disabled at a low level in the reading operation because the write recovery signal WRb output from the delay unit 10 is at a low level. But, the ras signal RAS is disabled in the writing operation after waiting until the write recovery signal WRb becomes a low level because the write recovery signal WRb output from the delay unit 10 is at a high level (refer to FIGS. 3 and 4).

Figure 3:
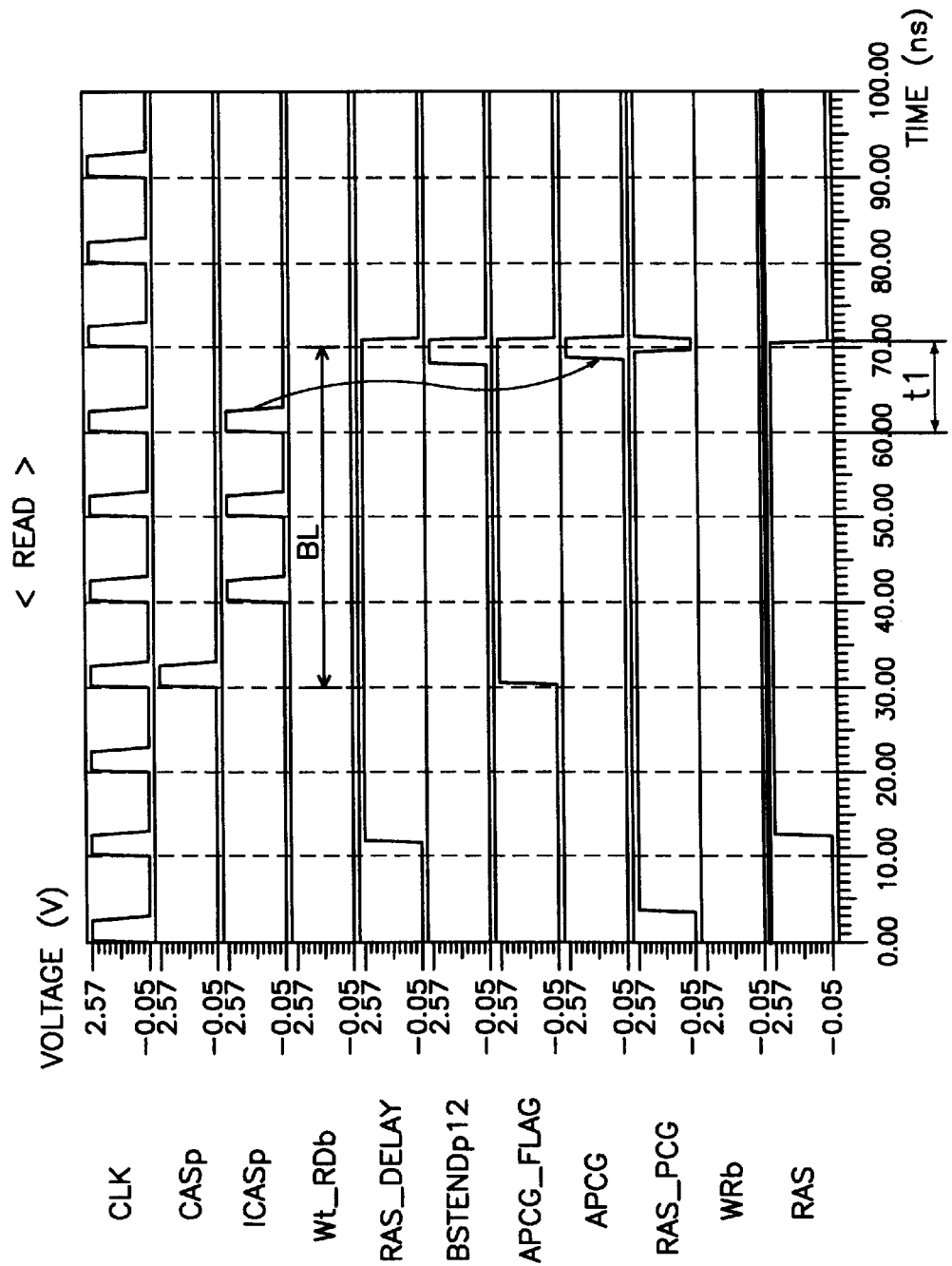
FIGS. 3 and 4 are timing diagrams illustrating operations of an automatic precharge apparatus of a semiconductor memory device shown in FIGS. 2a and 2b.
Figure 4:
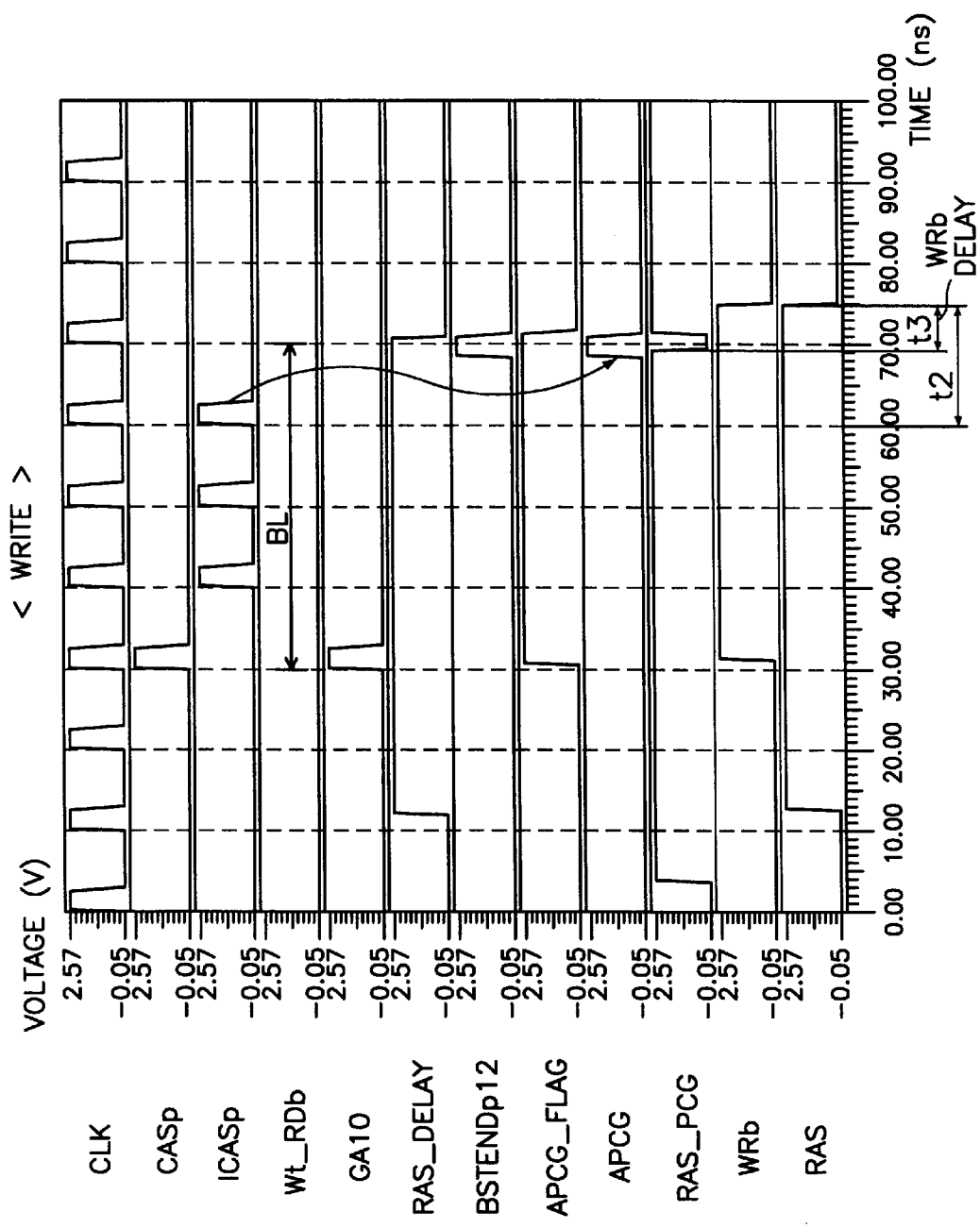

FIGS. 3 and 4 are timing charts diagrams explaining operations of an automatic precharge apparatus of a semiconductor memory device in accordance with a first embodiment of the present invention. When the internal precharge command signal APCG_FLAG is input in the writing/reading operation, in the reading operation, an automatic precharge operation is performed after a delay time of t1 following by the last bust operation and then the ras signal RAS is generated. In the writing operation, an automatic precharge operation is performed after a delay time of t2 following by the last bust operation and then the ras signal RAS is generated.

Accordingly, when an internal precharge command signal APCG_FLAG is inputted in the writing/reading operations, the write recovery signal WRb is output after a delay time of t3 in the writing operation, and the write recovery signal WRb is output without a delay time in the reading operation, thereby making the circuit capable of obtaining a margin of stabilized operation and realizing high speed in operation.

Figure 5A:
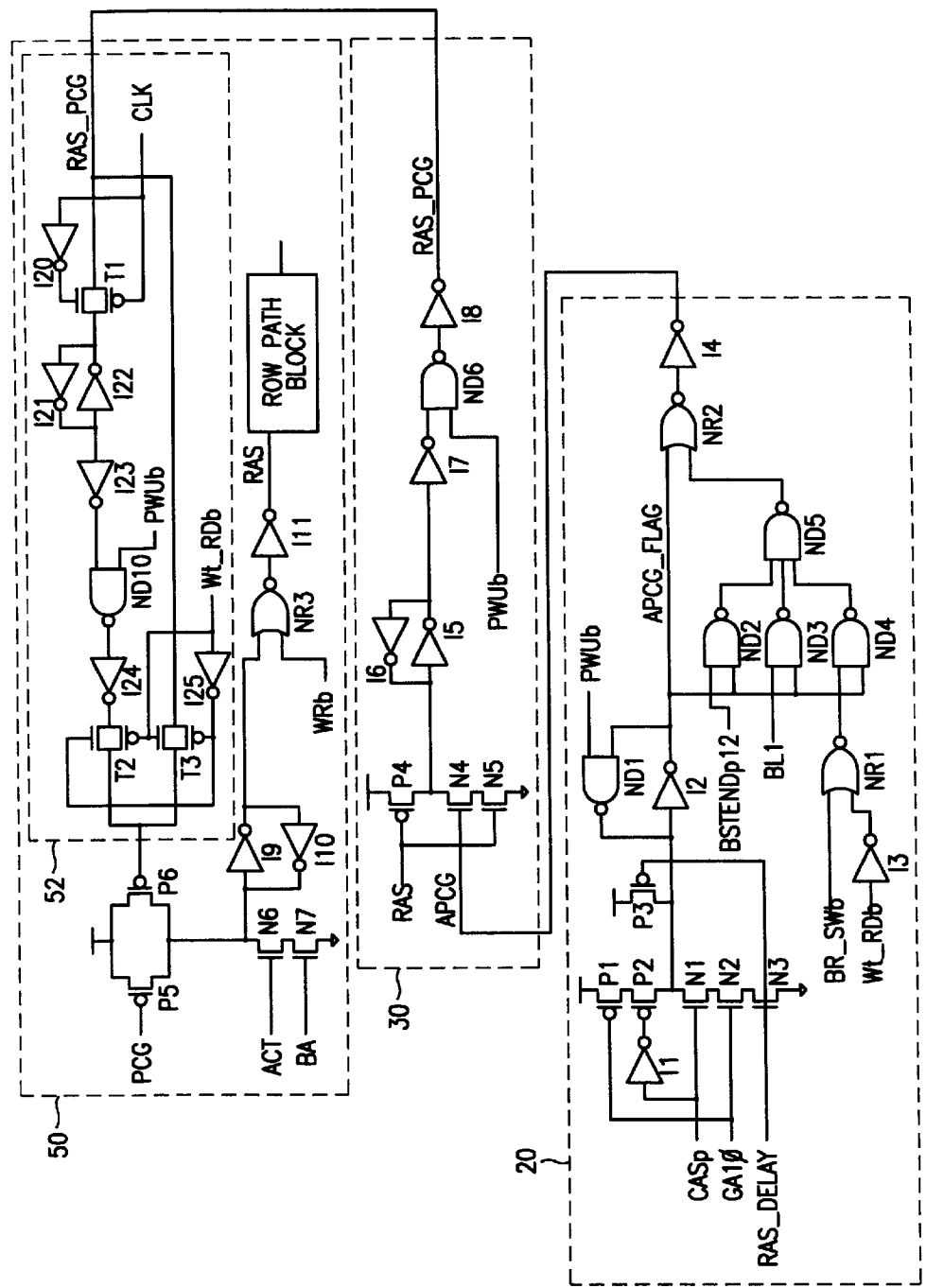
FIGS. 5a and 5b are a circuit diagrams of an automatic precharge apparatus of a semiconductor memory device in accordance with a second embodiment of the present invention.
Figure 5B:
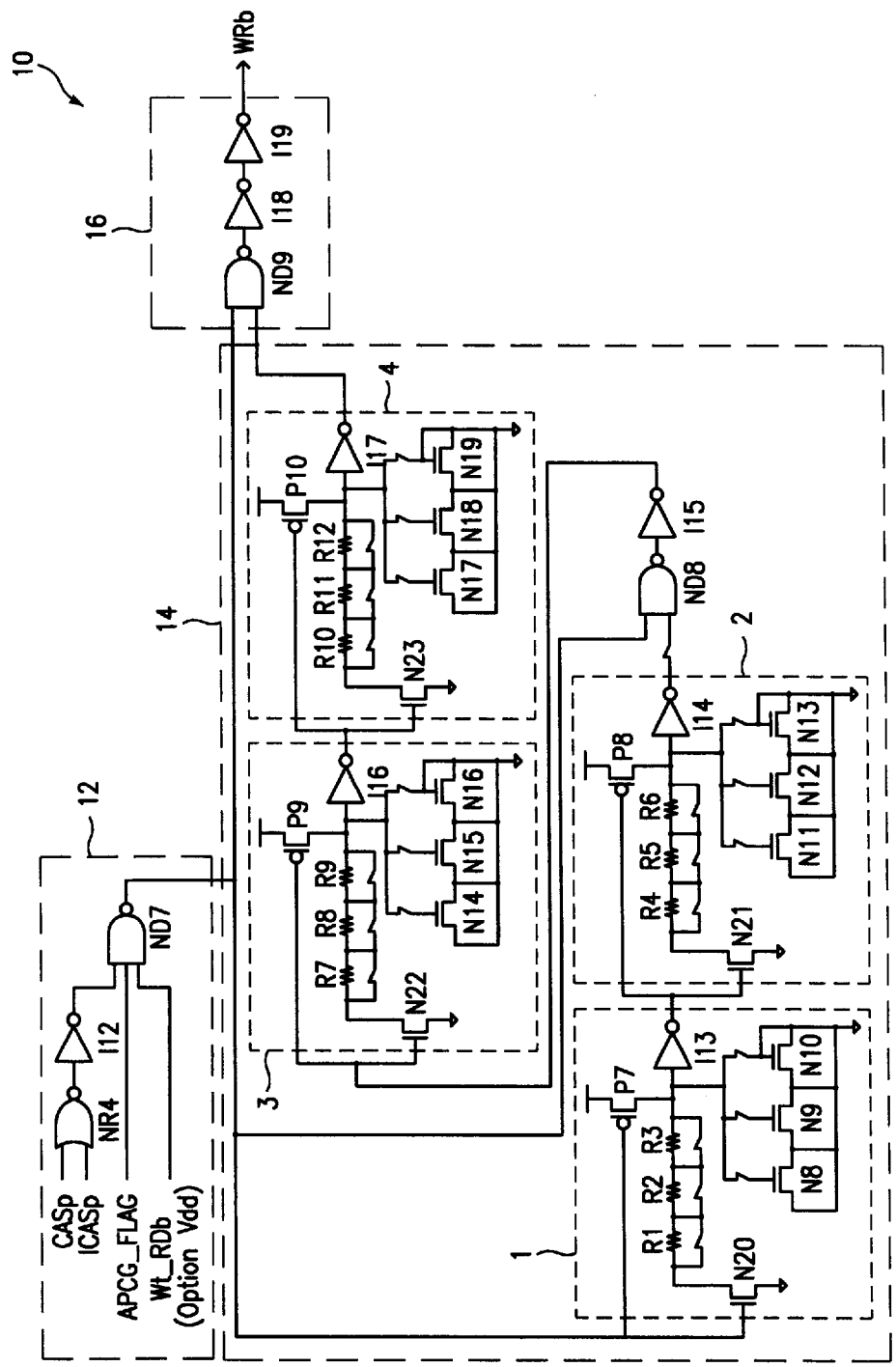

FIGS. 5a and 5b are circuit diagrams of an automatic precharge apparatus of a semiconductor memory device in accordance with a second exemplary embodiment of the present invention. When an automatic precharge command signal PCG is inputted from the outside, a precharge operation is performed without a delay time. When an internal precharge command signal APCG_FLAG is input, in the reading operation, a precharge operation is performed, synchronized with an external clock signal CLK after performing the last bust operation, and in the writing operation, a precharge operation is performed after a constant delay time following by the last bust operation.

The construction of the automatic precharge apparatus of a semiconductor memory device illustrated in FIGS. 5a and 5b is the same as that of the automatic precharge apparatus of a semiconductor illustrated in FIGS. 2a and 2b, excepting that a ras precharge signal transmission control unit 52 within the ras generating unit 50, and so an explanation of the parts common to both embodiments is omitted.

The ras precharge signal transmission control unit 52 (shown in FIG. 5a) comprises an inverter I20 for receiving and inverting a clock signal CLK. A transmission gate T1 receives and transmits the ras precharge signal RAS_PCG output from the ras precharge signal generating unit 30 under the control of the output signal of the inverter I20 and a clock signal CLK. Latch circuits I21 and I22 receive and latch the output signal of the transmission gate T1. An inverter I23 receives and inverts the output signal of the latch circuit. An NAND gate ND10 receives and logic combines the output signal of the inverter I23 and a power-up signal PWub. An inverter I24 receives and inverts the output signal of the NAND gate ND10. An inverter I25 receives and inverts the writing/reading signal Wt_RDb. A transmission gate T2 receives and transmits an output signal of the inverter I24 under the control of the writing/reading signal Wt_RDb and an output signal of the inverter I25. A transmission gate T3 receives and transmits the ras precharge signal RAS_PCG generated from the ras precharge signal generating unit 30 under the control of the writing/reading signal WT_RDb and the output of the inverter I25.

The operation of the ras generating unit 50 will now be described. Since a transmission gate T3 among two transmission gates T2 and T3 is opened when the writing/reading signal Wt_RDb is at a high level in the writing operation, it differs little in operation compared to the automatic precharge apparatus of a semiconductor memory device illustrated in FIGS. 2a and 2b. However, in the reading operation, the writing/reading signal Wt_RDb becomes a low level and so the transmission gate T2 is opened. When the transmission gate T2 is opened, although the ras precharge signal RAS_PACG output from the ras precharge signal generating unit 30 becomes low, since it waits until the transmission gate T1 is opened by the clock signal CLK, it is synchronized with the clock signal CLK. Thus, the automatic precharge signal APCG is output, always synchronized with the next clock signal in the reading operation and outputted after a predetermined constant delay time regardless of the clock signal in the writing operation.

Figure 6:
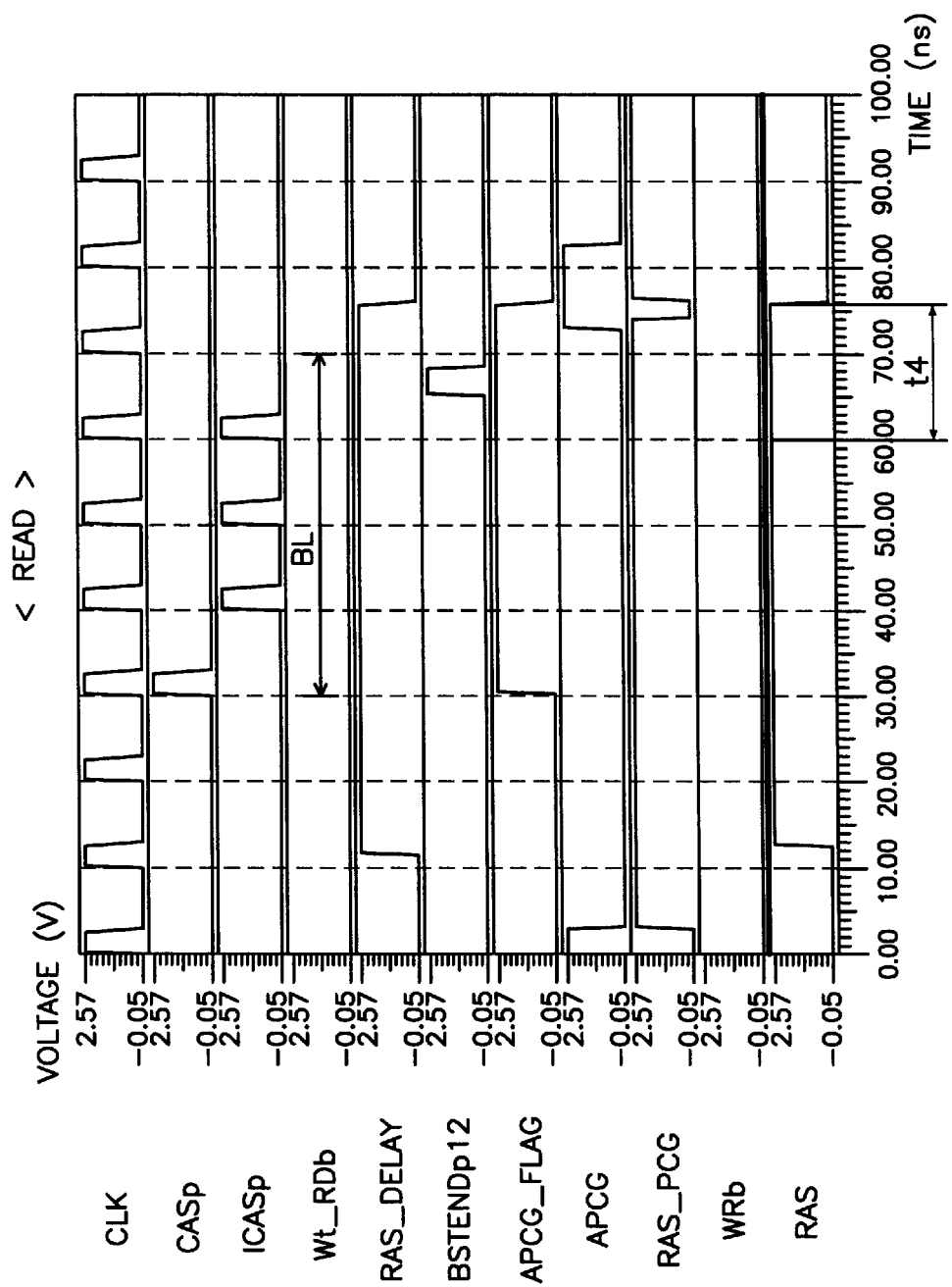
FIGS. 6 and 7 are timing diagrams illustrating operations of an automatic precharge apparatus of a semiconductor memory device shown in FIGS. 5a and 5b.
Figure 7:
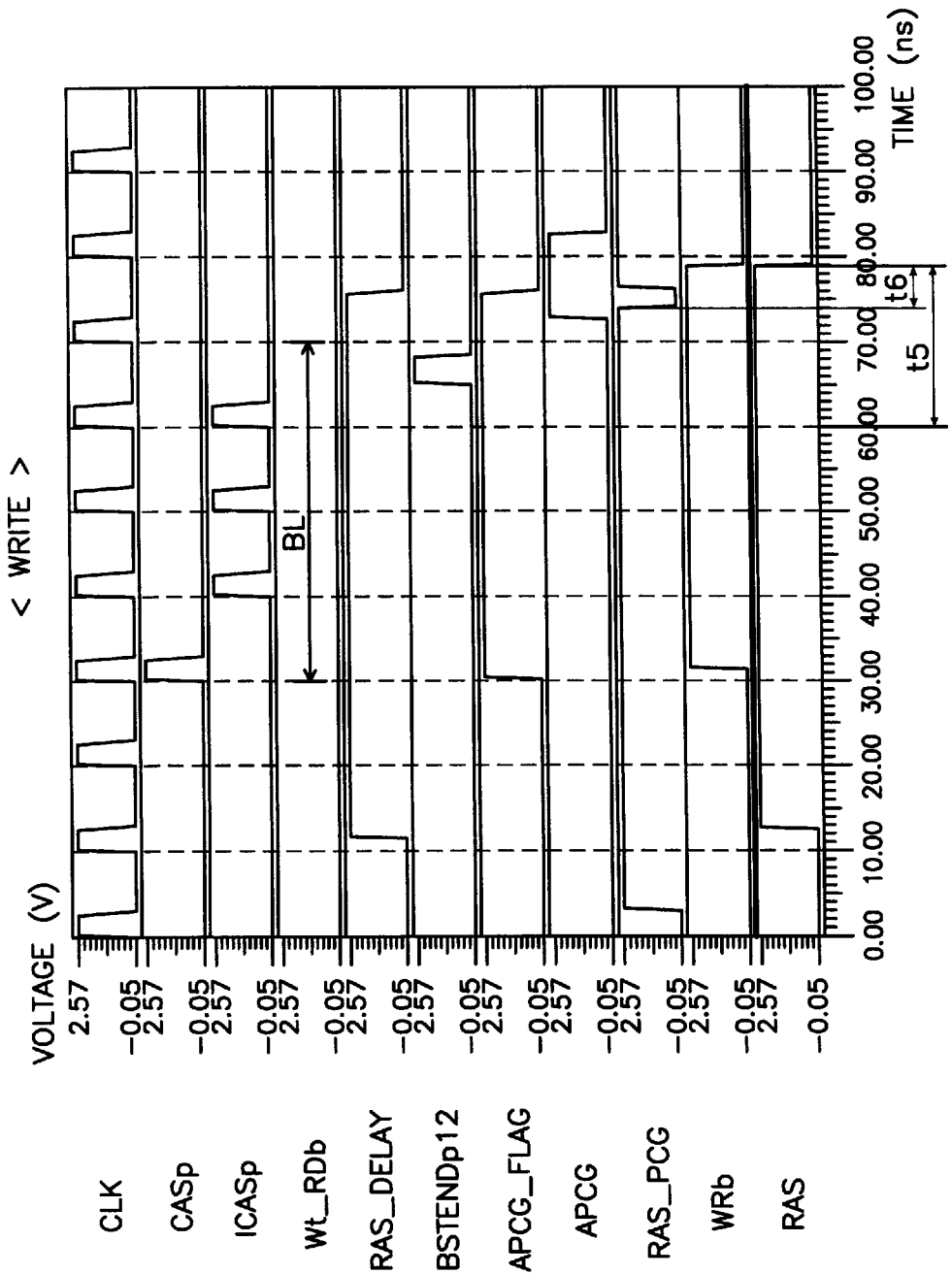

FIGS. 6 and 7 are timing diagrams illustrating operations of an automatic precharge apparatus of a semiconductor memory device in accordance with a second embodiment of the present invention. When the internal precharge command signal APCG_FLAG is input, in the reading operation, a precharge operation is performed after a delay time of t4, synchronized with a clock after performing the last bust operation. In the writing operation, a precharge operation is performed after a delay time of t5 following by the last bust operation.

Accordingly, in the writing/reading operation, when the internal precharge command signal APCG_FLAG is input, the write recovery signal WRb is output after a delay time of t6 in the write operation, thereby obtaining a margin of operation.

As described above, according to the automatic precharge apparatus of the present invention, when the external precharge command signal PCG is input from an external source, the precharge operation is performed without delay. However, when the internal precharge command signal APCG_FLAG is input, the precharge operation is performed after a constant delay time and so a stabilized precharge operation can be carried out without change of the clock frequency, thereby providing a margin of stabilized operation and realizing high speed in operation.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. An automatic precharge apparatus of a semiconductor memory device, comprising:
    an automatic precharge signal generating means for receiving external control signals and generating an internal precharge command signal, and outputting an automatic precharge signal by using the internal precharge command signal signal and control signals related to a bust operation,
    a ras precharge signal generating means for receiving the automatic precharge signal and then generating a ras precharge signal,
    a delay means for outputting a write recovery signal after a predetermined constant delay time, which is disabled in a reading operation and only enabled in a writing operation, when the internal precharge command signal is input during a writing/reading operation,
    a ras generating means for generating a ras signal without a delay when inputting an external precharge command signal, but generating the ras signal after the predetermined constant delay time in response to the write recovery signal when inputting the ras precharge signal.

2. The automatic precharge apparatus according to claim 1, wherein the delay means comprises:
    a logic circuit means for receiving and logic combining external and internal control signals, the internal precharge command signal, and a writing/reading signal,
    a delay circuit means for receiving and delaying an output signal from the logic circuit means, and
    an output buffer means for receiving and logic combining output signals of the logic circuit means and the delay circuit means and then outputting the write recovery signal.

3. The automatic precharge apparatus according to claim 2, wherein the delay circuit means comprises a plurality of delay control means, which delays the output signal of the logic circuit means with a constant time only during a writing operation.

4. The automatic precharge apparatus according to claim 3, wherein each delay means comprises:
    a first transistor connected with the power voltage and having a gate coupled to receive the output signal of the logic circuit means,
    a second transistor connected with the ground voltage and having a gate coupled to receive the output signal of the logic circuit means,
    a plurality of resistors connected between the first and second transistors,
    an inverting device connected to the last resistor among the plurality of resistors,
    a third transistor connected between the common contact point of the first transistor, the inverting device, and the last resistor among the plurality of resistors and the ground voltage.

5. The automatic precharge apparatus according to claim 2, wherein the logic circuit means comprises:
    a first logic device for receiving and logic combining the external and internal control signals, an inverting device for receiving and inverting an output signal of the first logic device, and
    a second logic device for receiving and logic combining an output signal of the inverting device, the internal precharge command signal, and the writing/reading signal.

6. The automatic precharge apparatus according to claim 2, wherein the output buffer means comprises a third logic device for receiving and logic combining the output signal of the logic circuit means and an output signal of a last delay control means among the plurality of delay control means, and a plurality of inverting devices for receiving and inverting the output signal of the third logic device.

7. The automatic precharge apparatus according to claim 1, wherein the ras generating means comprises:
    first and second transistors connected in parallel and for receiving an external precharge command signal and the ras precharge signal generated from the ras precharge signal generating means to their respective gates,
    third and fourth transistors connected in series and for receiving an active signal and a bank address signal to their respective gates, latch circuits connected with between the common contact point of the first and second transistors and the third transistor, a logic device for receiving and logic combining the output signal of the latch circuits and the write recovery signal outputted from the delay means, and an inverting device for receiving and inverting the output signal of the logic device and then generating a ras signal.

8. The automatic precharge apparatus according to claim 1, wherein the ras generating means comprises:

a ras precharge signal transmission control means for receiving the ras precharge signal outputted from the ras precharge signal generating means and a writing/reading signal and outputting a control signal, synchronizing a clock signal, first and second transistors connected in parallel and for receiving the output signal of the ras precharge control transmission control means and the external precharge command signal to their respective gates, third and fourth transistors connected in series and for receiving an active signal and a bank address signal to their respective gates, latch circuits connected with between the common contact point of the first and second transistors and the third transistor, a logic device for receiving and logic combining the output signal of the latch circuits and the write recovery signal outputted from the delay means, and an inverting device for receiving and inverting the output signal of the logic device and then generating a ras signal.

9. The automatic precharge apparatus according to claim 8, wherein the ras precharge transmission control means comprises:

a first transmission gate for receiving and transmitting the ras precharge signal, an inverting signal of the ras precharge signal and a clock signal, latch circuits for receiving and latching the output signal of the first transmission gate, a logic device for receiving and logic combining an inverting signal of the output signal of the latch circuits and a power-up signal, a second transmission gate for receiving and transmitting the inverting signals of the logic device and the writing/reading signal, a third transmission gate for receiving and transmitting the ras precharge signal, the inverting signal of the writing/reading signal.

10. An automatic precharger for a semiconductor memory, comprising:

an automatic precharge signal generator constructed and arranged to receive external control signals and generate an internal precharge command signal, and an output an automatic precharge signal by using the internal precharge command signal signal and control signals related to a bust operation, a ras precharge signal generator constructed and arranged to receive the automatic precharge signal and then generate a ras precharge signal, a delay element constructed and arranged to output a write recovery signal after a predetermined constant delay time, which is disabled in a reading operation and only enabled in a writing operation, when the internal precharge command signal is input during a writing/reading operation, a ras generator constructed and arranged to generate a ras signal without a delay when inputting an external precharge command signal, but generate the ras signal after the predetermined constant delay time in response to the write recovery signal when inputting the ras precharge signal.

11. The automatic precharger according to claim 10, wherein the delay element comprises:

a logic circuit constructed and arranged to receive and logic combine external and internal control signals, the internal precharge command signal, and a writing/reading signal, a delay circuit constructed and arranged to receive and delay an output signal from the logic circuit, and an output buffer constructed and arranged to receive and logic combine output signals of the logic circuit and the delay circuit and then output the write recovery signal.

12. The automatic precharger according to claim 11, wherein the delay circuit comprises a plurality of delay control elements, which delay the output signal of the logic circuit with a constant time only during a writing operation.

13. The automatic precharger according to claim 12, wherein the delay control elements each comprise:

a first transistor connected with the power voltage and having a gate coupled to receive the output signal of the logic circuit, a second transistor connected with the ground voltage and having a gate coupled to receive the output signal of the logic circuit, a plurality of resistors connected between the first and second transistors, an inverting device connected to the last resistor among the plurality of resistors, a third transistor connected between the common contact point of the first transistor, the inverting device, and the last resistor among the plurality of resistors and the ground voltage.

14. The automatic precharger according to claim 11, wherein the logic circuit comprises:

a first logic device constructed and arranged to receive and logic combine the external and internal control signals, an inverting device constructed and arranged to receive and invert an output signal of the first logic device, and a second logic device constructed and arranged to receive and logic combine an output signal of the inverting device, the internal precharge command signal, and the writing/reading signal.

15. The automatic precharger according to claim 12, wherein the output buffer comprises a third logic device for receiving and logic combining the output signal of the logic circuit and an output signal of a last delay control element among the plurality of delay control elements, and a plurality of inverting devices constructed and arranged to receive and invert the output signal of the third logic device.

16. The automatic precharger according to claim 10, wherein the ras generator comprises:

first and second transistors connected in parallel and arranged to receive an external precharge command signal and the ras precharge signal generated from the ras precharge signal generator to their respective gates, third and fourth transistors connected in series and for receiving an active signal and a bank address signal to their respective gates, latch circuits connected with between the common contact point of the first and second transistors and the third transistor, a logic device for receiving and logic combining the output signal of the latch circuits and the write recovery signal outputted from the delay means, and an inverting device for receiving and inverting the output signal of the logic device and then generating a ras signal.

17. The automatic precharger according to claim 10, wherein the ras generator comprises:

a ras precharge signal transmission control circuit constructed and arranged to receive the ras precharge signal output from the ras precharge signal generator and a writing/reading signal and outputting a control signal, synchronizing a clock signal, first and second transistors connected in parallel and arranged to receive the output signal of the ras precharge control transmission control circuit and the external precharge command signal to their respective gates, third and fourth transistors connected in series and for receiving an active signal and a bank address signal to their respective gates, latch circuits connected with between the common contact point of the first and second transistors and the third transistor, a logic device for receiving and logic combining the output signal of the latch circuits and the write recovery signal outputted from the delay elements, and an inverting device for receiving and inverting the output signal of the logic device and then generating a ras signal.

18. The automatic precharger according to claim 17, wherein the ras precharge transmission control circuit comprises:

a first transmission gate constructed and arranged to receive and transmit the ras precharge signal, an inverting signal of the ras precharge signal and a clock signal, latch circuits constructed and arranged to receive and latch the output signal of the first transmission gate, a logic device constructed and arranged to receive and logic combine an inverting signal of the output signal of the latch circuits and a power-up signal, a second transmission gate constructed and arranged to receive and transmit the inverting signals of the logic device and the writing/reading signal, a third transmission gate constructed and arranged to receive and transmit the ras precharge signal, the inverting signal of the writing/reading signal.

* * * * *